United States Patent
Das

(10) Patent No.: US 6,553,524 B1
(45) Date of Patent: Apr. 22, 2003

(54) METHOD FOR AUTOMATING VALIDATION OF INTEGRATED CIRCUIT TEST LOGIC

(75) Inventor: Subrangshu Kumar Das, Fort Collins, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 400 days.

(21) Appl. No.: 09/615,343

(22) Filed: Jul. 12, 2000

(51) Int. Cl.[7] .............................................. G01R 31/28
(52) U.S. Cl. ..................................................... 714/726
(58) Field of Search ................................ 714/726, 724, 714/727, 30; 324/158.1; 326/16; 365/201

(56) References Cited

U.S. PATENT DOCUMENTS

| | | | |
|---|---|---|---|
| 5,185,745 A | | 2/1993 | Manca .................... 371/22.3 |
| 5,519,714 A | * | 5/1996 | Nakamura et al. .......... 714/726 |
| 5,682,392 A | | 10/1997 | Raymond et al. .......... 371/22.3 |
| 5,684,808 A | * | 11/1997 | Valind ....................... 714/726 |
| 5,715,171 A | | 2/1998 | Mori et al. ................. 364/490 |
| 6,073,260 A | * | 6/2000 | Kurita ....................... 714/724 |
| 6,289,472 B1 | * | 9/2001 | Antheunisse et al. ......... 714/25 |
| 6,311,301 B1 | * | 10/2001 | Posse et al. ................ 714/724 |
| 6,327,683 B1 | * | 12/2001 | MacCormack .............. 714/726 |

FOREIGN PATENT DOCUMENTS

EP          1130410 A2      9/2001

* cited by examiner

Primary Examiner—Albert Decady
Assistant Examiner—Esaw Abraham

(57) ABSTRACT

A methodology for automatic validation of integrated circuit (IC) test hardware that is performed during extraction of the test hardware. Signal connectivity between output test ports of one or more test control blocks and serially-connected scan latches of the test hardware is automatically validated, as is inter-connectivity between the serially-connected scan latches. Every instance to which a test signal and a test data signal at an output test port (both test signal and test data ports) of a test control block fans out to is traversed until a scan latch is reached in order to provide electrical and functional verification of the test hardware.

20 Claims, 5 Drawing Sheets

BLOCK NAND 2
PORTS: A, B, Z, VDD, GND
SIGNALS: A, B, Z, VDD, GND, X
INSTANCES: I1, I2, I3, I4
INSTANCE CONNECTIONS:
   I1: DRAIN=Z GATE=A SOURCE=VDD;
   I2: DRAIN=Z GATE=B SOURCE=VDD;
   I3: DRAIN=Z GATE=A SOURCE=X;
   I4: DRAIN=X GATE=B SOURCE=G.

BDL OUTPUT OF A NAND 2 GATE

METHOD FOR AUTOMATING VALIDATION OF INTEGRATED CIRCUIT TEST LOGIC

FIELD OF THE INVENTION

The presented invention relates generally to the use of test logic hardware to prove out integrated circuit design and, more particularly, to a method for automatic validation of integrated circuit test logic.

BACKGROUND OF THE INVENTION

The soundness of the logic design of an integrated circuit (IC) device or part must be tested prior to actually manufacturing the hardware. This is especially true of extremely complicated and exceedingly dense ICs, such as complex central processor units (CPUs) and microprocessors, which may have close to a billon transistors. Now in order to be able to observe the minute details of the inner workings of such extremely complex devices after manufacture, appropriate test circuitry, in addition to the other functional pieces of logic hardware, needs to be designed inside of the chip during the design phase of the chip.

Unlike major functional blocks of the chip, such as an integer block or a floating point block whose die location can be precisely determined, however, the entire test hardware of the chip is composed of a great number of serially connected test components called scan latches that are scattered through the chip to ensure that observability and controllability are provided for each and every portion of the chip. FIG. 1 illustrates a sample scan latch composed of a test latch portion electrically coupled to a functional portion, as indicated by the dashed lines. It can be seen that the test latch portion is provided with test data input, TDI, which can be provided locally to the scan latch, and controlled by various test signals, such as SHIFT, NSHIFT, LOAD (WRITE), and UPDATE (READ), to capture functional data OUT and output test data output (TDO), which is in turn provided to the functional latch portion. The functional latch portion is controlled by a qualified clock signal, CKQ, which in turn is controlled by an appropriate test signal (not shown here) to ensure that the output signal OUT of the scan latch is controlled by TDO (via the WRITE test signal) when the IC chip is in the test mode and by the IN data input in the normal operating mode.

In the normal operating mode, WRITE test signal is OFF while CKQ fires. If the WRITE test signal does not fire, the functional and test latch portions perform independently. The normal data, IN, is passed through to the output signal OUT in the normal operating mode. Conversely, in the test operating mode, firing the WRITE test signal controls the output signal OUT. The UPDATE (READ) status signal transitions to read in the captured data OUT and the SHIFT and NSHIFT signals shift TDI into the scan latch and also transfer captured data OUT through the scan latch. The WRITE test signal fires, thereby transferring the local test data out TDO to the functional latch.

The test signals, such as SHIFT, NSHIFT, LOAD (WRITE), and UPDATE (READ), that are used to control the operation of the scan latches are produced from a single test control block, called a test access port (TAP), which can control operation of the entire test hardware of the chip. Often, however, the overall control of the test hardware scan latches is broken down between smaller test control blocks, called mini test access ports (MTAPs), that are each centrally controlled by a single, and much simpler, TAP. Each MTAP provides data and test signals to a series of scan chains or scan paths that are connected in parallel. Each MTAP, and its corresponding scan chains, may typically be dedicated to testing a particular functionality of the chip. To this end, it is not uncommon to have a particular MTAP and set of scan chains dedicated to a particular functional block, such as a floating point block, for instance. There is no requirement, however, of a one-to-one correspondence between MTAP/scan chains and functional block. Thus, each block, or sub-block, or functional piece of the IC chip may have two or more MTAP/associated scan chains combinations.

An illustration of such a distributed test architecture is shown in FIG. 2. As previously mentioned, the scan latches that make up the test hardware of the chip are organized as serially connected test components. Related scan latches that are used for testing a particular functional piece of the IC device, such as a particular type of block or a functional sub-block of a block, are serially arranged in a particular scan path; multiple scan paths of a particular MTAP are connected in parallel to one another. The TAP is provided with various input test signals, shown here as TRST (test reset), TCK (test clock), TMS (test mode select), TDI (global), and TDO (global). The global data and test signal are provided to each of the MTAPs by the TAP. Each MTAP, in turn, provides its corresponding scan paths with local normal and test input data and test signals appropriate to the particular block, sub-block, or functional bit of the IC chip they are serving. The local test results are provided by the scan paths back to their particular MTAP, which in turn provides the test data back to the TAP over a global connection. It is noted here that global as used herein refers to signal communications between the TAP and the MTAPs, typically across functional blocks of the IC chip. Typically communications between MTAPs and their scan paths will occur within a functional block of the IC chip and thus be local in nature. FIG. 3 illustrates the serial connection of two scan latches in a simple scan chain; of course, an IC chip will have thousands or more such serially connected latches in a scan chain. In a scan chain or scan path, normal input data NDI and test input data TDI, as well as test signals, such as SHIFT, NSHIFT, LOAD (WRITE), and UPDATE (READ), will be provided to the initial scan latch. Depending upon whether the IC is in the normal operating mode or the test operating mode, the initial scan latch will pass along the appropriate type of data to the next scan latch in the scan chain via logic circuitry by which contiguous scan latches in the chain can communicate.

It is current practice in the art for a chip design team to spent a great amount of time adding a few extra pieces of hardware to obtain specific performance benefits and/or to port or re-layout an existing design to a new manufacturing process in order to improve performance. Although this means that most blocks are virtually untouched in terms of any change in functionality, this is not true for the test hardware. Any new hardware that is added will need to have test circuitry in the form of scan latches built inside it to be able to observe and control certain critical functional signals during the debug and characterization phase of a chip after it has been manufactured. These scan latches will then need to be serially connected to each other and also to the global scan chains described above. The appropriate test signals will need to be routed over to the new piece of test hardware from the test control blocks (TAP and MTAPS). Any porting of an existing design to a new manufacturing process causes metal routes to be relocated and replaced with faster metal layers, thereby causing the occasional opens, shorts and faulty connections in global test signals and in functional signals. And for purely functional signals, possible problems are found during functional verification of the chip, as well as or in addition to, during static or dynamic timing analysis of the chip. But the validation of test signals and test hardware requires a whole new effort because the test hardware is almost always very simplistically modeled in global functional verification runs that tend to focus on strictly design (not test) issues and is also almost always generally ignored in global static/dynamic timing runs. Since the test control blocks (TAP and MTAP) are almost untouched, except for porting the design to a new manufacturing process, etc., the validation effort on test hardware should focus heavily on having the correct connectivity of the test signals to the scan latches themselves. Also, electrical quality of the scan latches, ascertained by checking the strength of the feedback inverter to prevent flipping the latch on a noise event at the input, checking the output drive strength of one scan latch to see that it is sufficient to toggle the subsequent scan latch, etc., and global routings for the test signals should also be verified so that the target scan frequency (the rate of transfer of captured data and/or test data through the scan latches) can be obtained.

Now while the importance of test hardware cannot be over-emphasized for today's highly integrated chip devices, its significance is often undermined because of the competitive benefits believed to accrue with other, real performance measures like clock frequency, cache size, accurate branch prediction techniques. A poorly designed and validated test hardware approach, however, can make debugging designs in real silicon a nightmare, often greatly adding to the amount of time required to get a product to market.

There are several disadvantages associated with traditional approaches to validating test hardware. First, traditional approaches may rely upon the readiness or "cleanliness" of an entire block or a large piece of a block, when the test hardware inside the block usually accounts for only a small portion of the total silicon "real estate" of the block; test hardware may often account for less than five percent of the total real-estate of a block, for instance. Second, block databases may be required and represent a cumbersome requirement that greatly adds to the overhead associated with testing. Third, a lot of the scan latches of the test circuitry are themselves disjointed in the sense that the functional and test portions of a scan latch may often be physically separate logic represented by different artwork describing layout of the respective circuitries. This is especially the case in logic related to dynamic circuits in which the functional piece and the test piece of the scan latch may be separate leaf cells but test signals will still reach the functional leaf cell. Since the functional piece is properly not considered part of the test portion of the scan latch, the test ports of the functional piece are not checked to make sure that they are connected to the correct global test signals. For instance, in the case of a dynamic bus which has multiple functional pieces of logic driving the bus and a single scan latch to control it, it is very difficult to test these functional pieces which receive their own, often distinct, test signals. Fourth, the functional simulator used to verify test signals often runs into difficulty in understanding some special circuits, such as sense amplifier circuits in caches, phase lock loops (PLL), etc. While these circuits have nothing to do with the test logic per se, a considerable amount of time must be spent in describing them to the functional simulator so that the simulation can be performed.

SUMMARY OF THE INVENTION

The present invention presents a method for automatic validation during BDL extraction of test hardware of an integrated circuit device. A test hardware portion of connectivity of the integrated circuit device is extracted; electrical and functional validation of the scan latches, test control blocks and test signals of the test hardware is performed during extraction. Following extraction and validation of the test hardware portion, the test hardware portion may be represented in a block description language. Any logged errors, such as test signal connectivity errors, scan latch inter-connectivity errors, etc., that are identified during the extraction and validation process may be used by IC designers to improve the test hardware portion.

During the first extraction procedure, the connectivity of test signals, which reside at a number of test signal output ports of a test control block of the test hardware portion having serially-connected scan latch instances, to the serially-connected scan latch instances is determined. Any test signal connectivity errors identified during the first extraction procedure are generated and logged for future reference. During a second extraction procedure, the inter-connectivity of the scan latch instances is validated. Any scan latch inter-connectivity errors identified during this validation pass, are generated and logged for future reference.

This procedure may be repeated for any test control block (TAP, MTAPs) of the test hardware portion. The extracted and validated test hardware portion of the connectivity of the test hardware is in a block description language. Any results recording during the extraction and validation process can be used by the designers to improve the test hardware. The methodology of the present invention may be implemented as executable computer program instructions of a computer readable medium executed by a processing system.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DESCRIPTION OF THE INVENTION

The methodology of the present invention provides a technique for automating validation of test hardware that focuses heavily on achieving the correct connectivity of test signals, both global and local, to the scan latches and on achieving the correct inter-connectivity between the scan latches themselves. The automatic validation of these important features of the test hardware allows for improved screening of IC parts, characterizing good parts, and debugging possible electrical and functional issues in IC chips.

Figure 4:
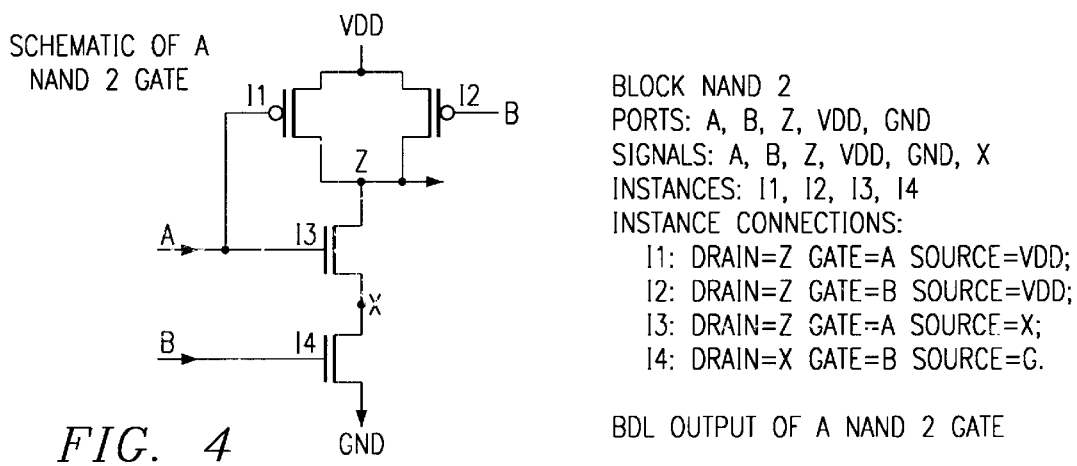
FIG. 4 is an illustration of block description language (BDL).
Figure 2:
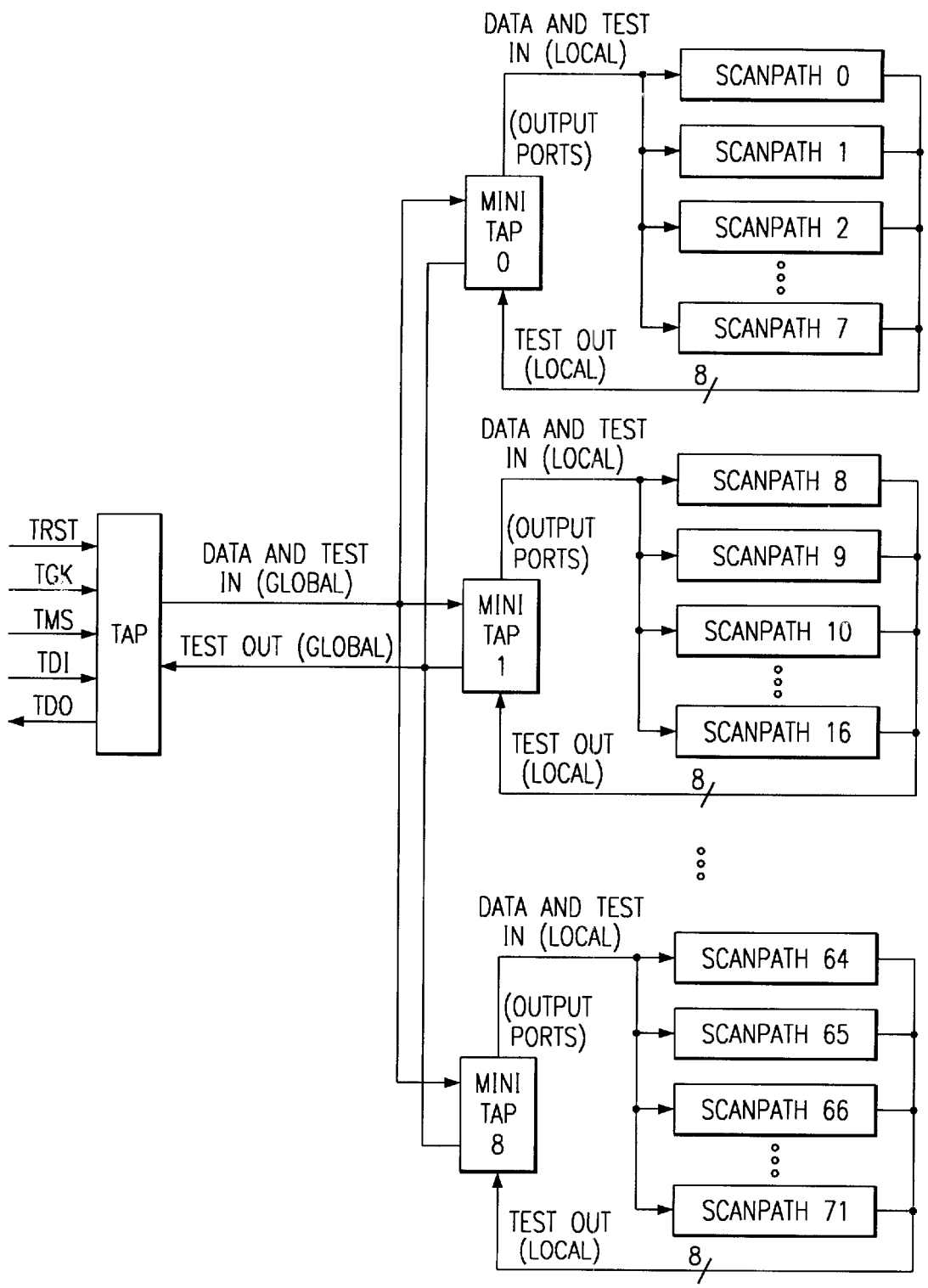
FIG. 2 is an interconnect diagram that illustrates an example of the architecture of the test hardware of an integrated circuit device, in accordance with the present invention.

Block description language (BDL) is used to accurately describe the circuit description of a block, either at the schematic or layout/artwork level. FIG. 4 illustrates the BDL output (on the right side of the drawing) generated for a simple two-input NAND gate schematic (shown on the left side of the drawing). It can be seen that the two-input NAND gate circuit has a total of five ports-ports for input signals A, B, ports for voltage reference signals VDD and GND, and a port for output signal Z. There is additionally another signal of interest, X at the node between transistors controlled by signals A and B. The instances (current flow) for this circuits are 11, 12, 13, and 14. The Instances connections are spelled out in the BDL output as shown.

Now the basic BDL principles illustrated above can be extended to so-called hierarchical BDL to describe hierarchical blocks of a circuit. In a hierarchical hardware design, a big block is composed of smaller block, which in turn are composed of even smaller blocks until the field effect transistor(FET)-level of the circuit is reached. A hierarchical BDL consists of a BDL description for each level of blocks until the leaf cell is reached. The leaf cell is a cell or block that is only composed of FETs. For instance, the NAND gate circuit of FIG. 4 is a leaf cell, being composed solely of FETs. An AND gate coupled to a subsequent OR gate, however, is not composed solely of transistors and is thus not a leaf cell for purposes of this discussion.

Figure 5:
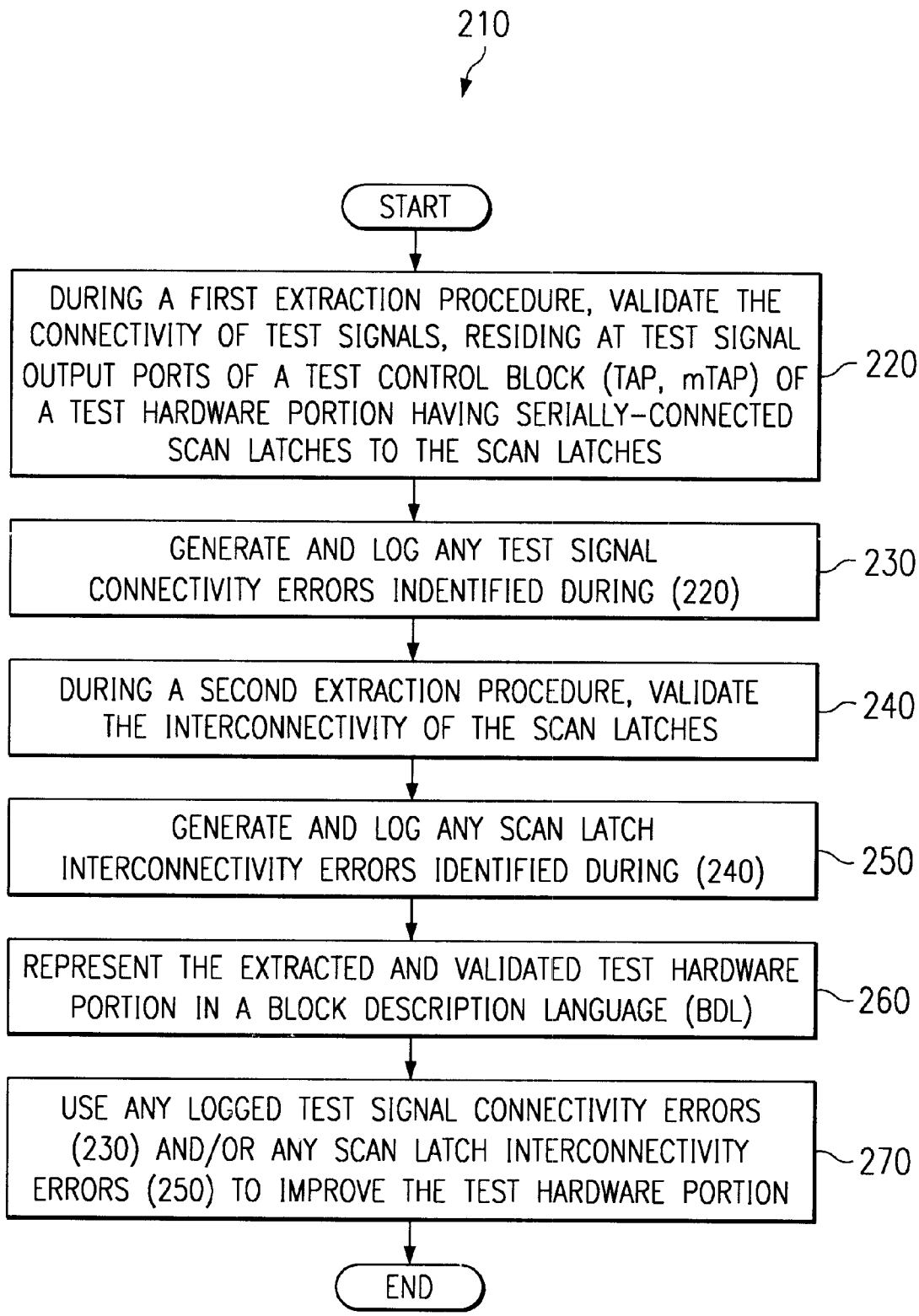
FIGS. 5–6 illustrate an overall flow diagram of the methodology for extraction and validation of test hardware, in accordance with a preferred embodiment of the present invention.
Figure 6A:
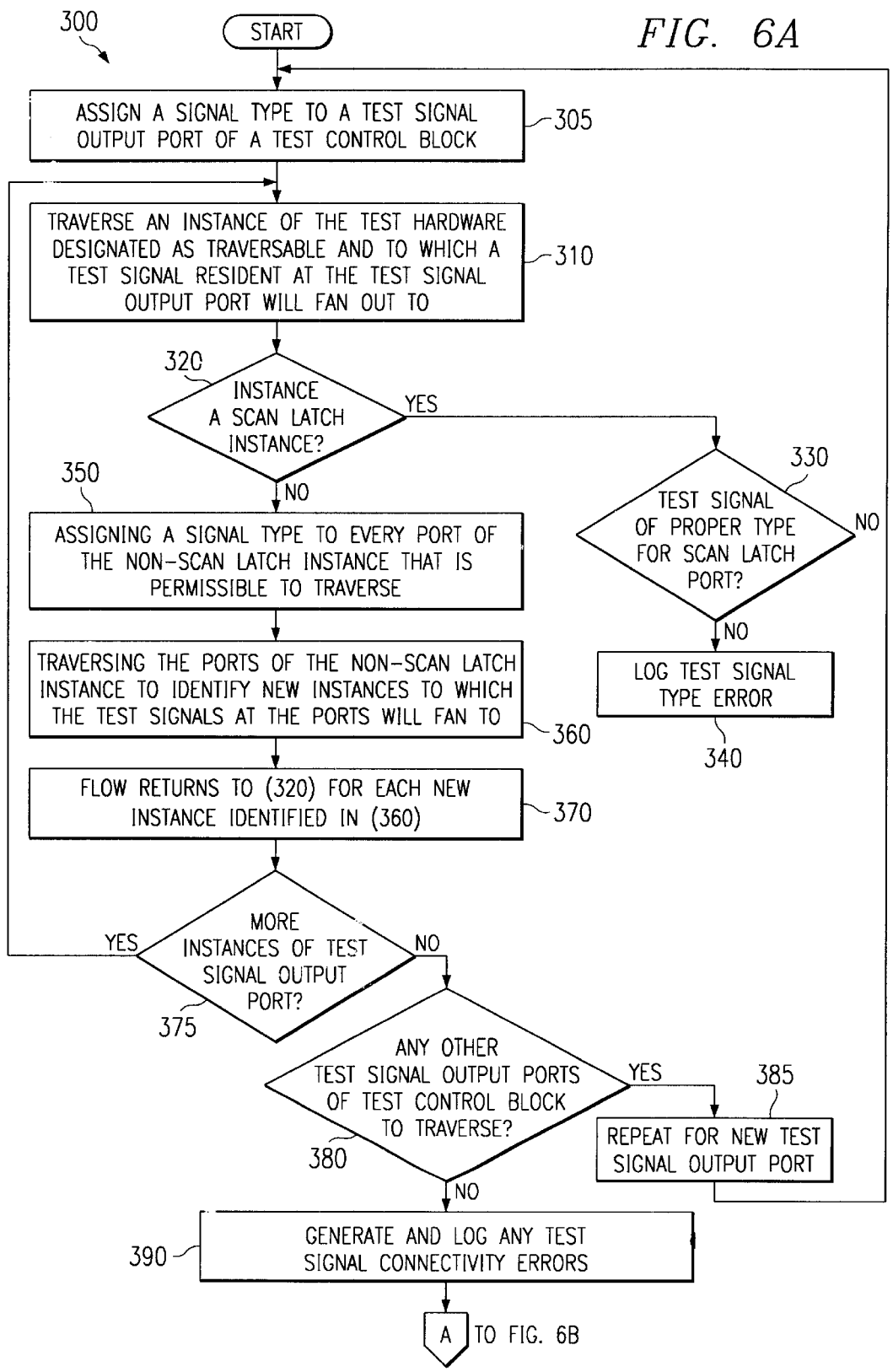
Figure 6B:
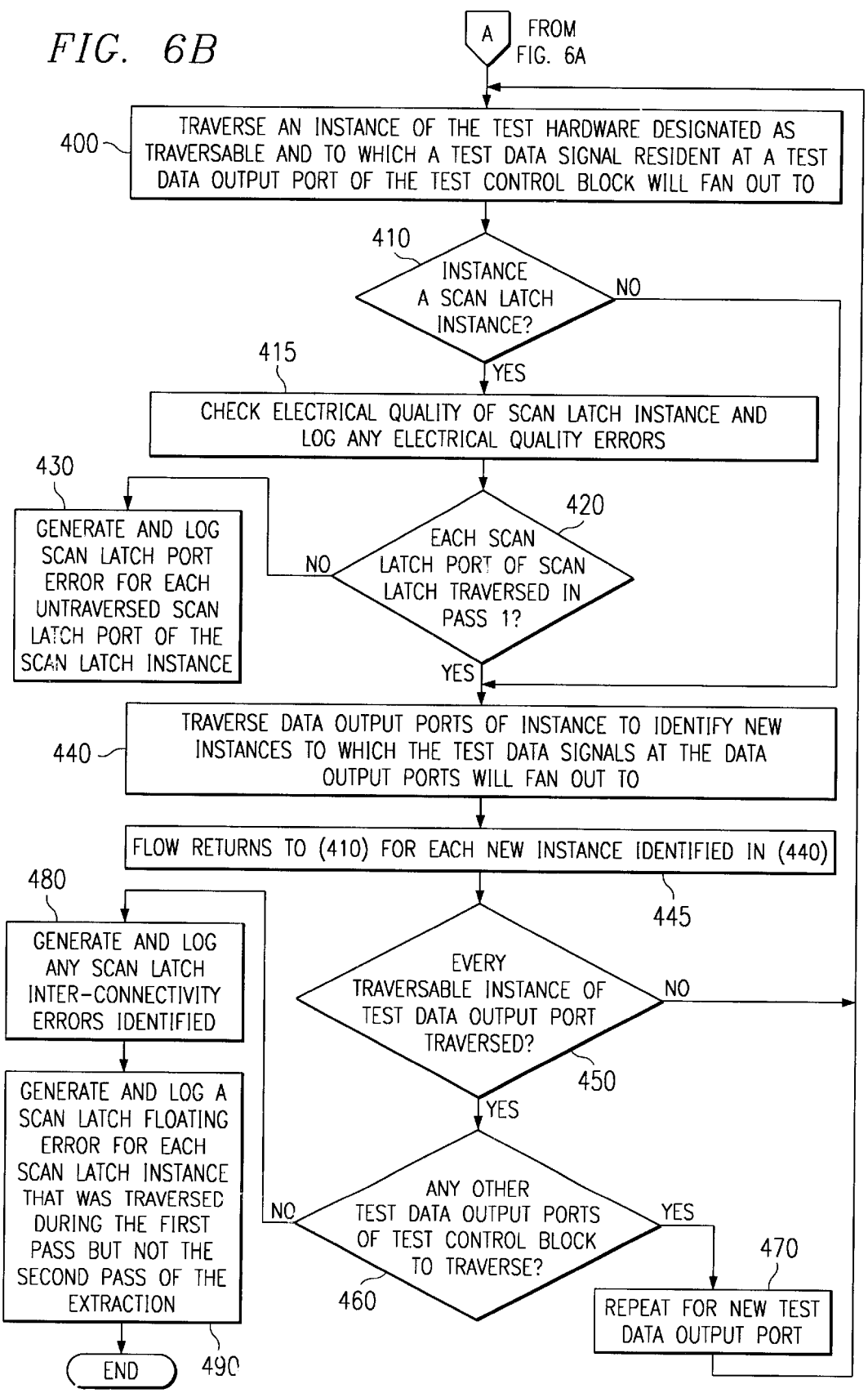

Referring now to FIG. 5, a flow chart 200 that illustrates the overall methodology of the present invention for performing automatic validation of test hardware of an integrated circuit device is shown. FIG. 6 illustrates the preferred embodiment of this methodology for automatic validation of the test hardware during the extraction process. As used herein, test hardware portion can refer to the entire test hardware circuitry of the chip or a portion thereof; at any rate, a test hardware portion is always a portion of the entire IC circuitry. The validation of the test hardware occurs two chronologically arranged extraction procedures. During the first extraction procedure, of Block 220, the connectivity of the test signals (both global and/or local), that reside at the test signal output ports of a test control block, such as TAP or MTAP, of a given test hardware portion of interest, to serially-connected scan latches (also referred to as scan latch instances) of the hardware is explored. At Block 230, any errors uncovered during this validation procedure, referred to as test signal connectivity errors, are generated and logged for future use. During the second extraction procedure, shown at Block 240, the inter-connectivity between the scan latches themselves is explored. Any inter-connectivity errors identified during the second extraction procedure are generated and logged at Block 250. At Block 260, the extracted and validated test hardware portion is described in a block description language (BDL). At Block 270, any logged test signal connectivity errors, discovered at Block 230, and/or any scan latch interconnectivity errors, discovered at Block 250, may be used by the chip designers to improve discovered electrical deficiencies of the test hardware portion.

Figure 1:
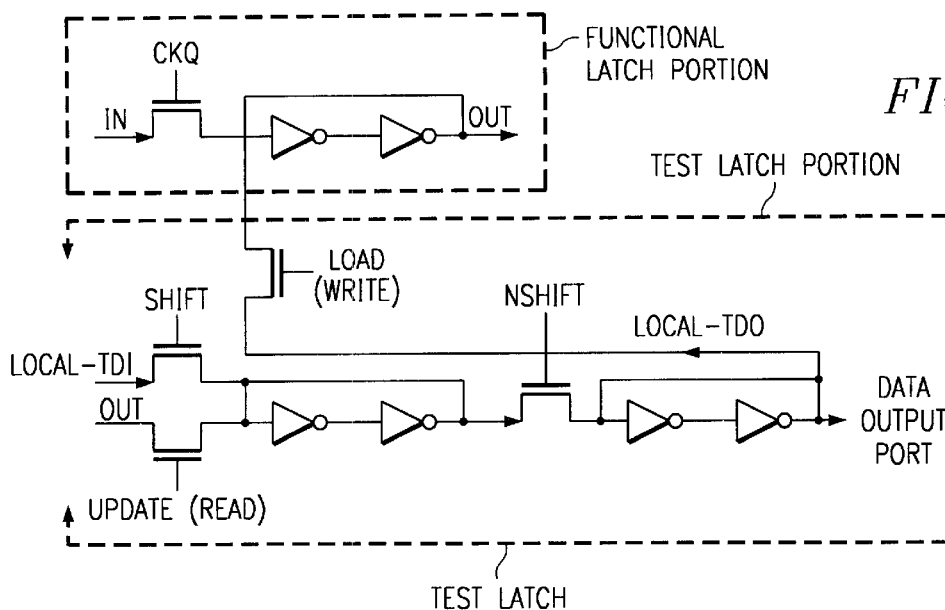
FIG. 1 is a schematic diagram of a sample scan latch, in accordance with the present invention.
Figure 3:
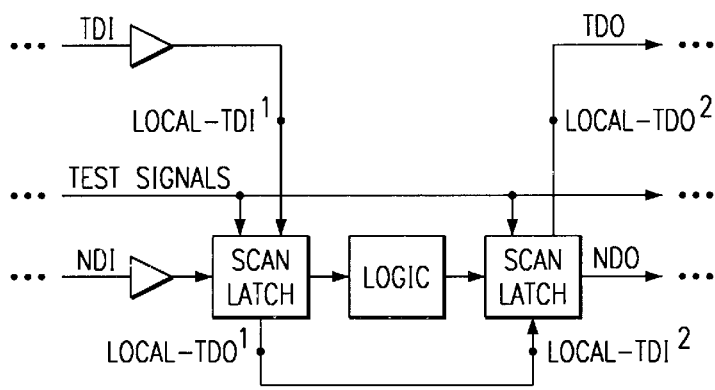
FIG. 3 is a block diagram that illustrates a simplistic scan chain or scan path, in accordance with the present invention.

Referring now to FIG. 6, the methodology for automatic validation of the electrical characteristics of a test hardware portion and further corresponding to Blocks 210–250 of FIG. 5 is illustrated; the extraction and validation methodology of FIG. 6 is followed by Blocks 260 and 270 of FIG. 5. This methodology allows the connectivity of the test signals provided to the scan latches and the inter-connectivity between the scan latches themselves to be validated. During a first pass of the extraction operation, the connectivity of the test signals provided by a given test control block, such as a TAP or a MTAP, are validated. The first extraction procedure pass is shown in Blocks 310–390 of FIG. 6. At Block 305, a signal type is assigned to a particular test signal output port of a given test control block of interest. At Block 310, an instance of a number of instances to which a test signal at the particular test signal output port of the test control block will fan (and which is also designated as being traversable) is traversed. This traversal of the instance is used to determine whether the instance is a scan latch instance, as noted at Decision Block 320. Disjointed scan latches are included in the inquiry about whether the instance under scrutiny is a scan latch. As previously mentioned, scan latches of the test circuitry can be disjointed if the functional and test portions of the scan latch (shown in FIG. 1) are representative of two different leaf cells of separate logic that is represented by different artwork that describes the respective circuitries. Again, this is especially of concern in dynamic logic circuits in which the functional piece and the test piece of the scan latch may be separate leaf cells but test signals will still reach the functional leaf cell.

If the instance is a scan latch, then the inquiry at Decision Block 330 is whether the test signal at a scan latch port of the scan latch instance is the proper type for the scan latch port. Each test port of a scan latch instance may only properly be connected to certain types of test signals, such as SHIFT, WRITE, READ test signals, etc., and these requirements may be stored in a file having an entry for each scan latch test port to indicate what types of test signals are acceptable. If the test signal is not the type of test signal that can be accepted by the scan latch port, then a test signal type error is logged at Block 340.

Returning again to Decision Block 320, if the instance that has been traversed is not a scan latch type of instance (it may be a AND gate, an inverter, etc.) then at Block 350 a signal type is assigned for every port of the instance that is permissible to traverse. The signal type that is assigned for each instance port is a function of the instance type and the type of input signal that is provided to the instance. At Block 360, all of the traversable ports of the non-scan latch instance are traversed to identify all new instances to which the test signals will and can flow from the scan latch ports, no matter how many levels need to be traversed. For each and every newly found instance in Block 360, Block 370 ensures that the validation provided by Blocks 320–370 is recursively performed. This may mean that a great number of loopbacks will occur, depending upon the number of instances newly identified in Block 360 at that level. For example, if there are a total of 1000 new instances identified in Block 360, then the loop of Blocks 320–370 will be performed 1000 times. This iterative process of finding new instances and validating each of them must be completed before the flow continues to Block 375.

Next, at Decision Block 375, it must be determined whether every instance of the test signal output port that has been designated as being traversable has indeed been traversed. If every instance has not been traversed for the test signal output port of interest, then the flow returns to Block 310. If, however, every traversable instance of a test signal output port has been traversed, then the next inquiry, at Decision Block 380, is whether there are any other test signal output ports of the test control block that needed to be traversed. If so, then the flow of Blocks 305–375 must be repeated for a previously untraversed test signal output port as indicated by Block 385. If, however, every test signal output port of the test control block has been traversed, then any test signal connectivity errors discovered during the first extraction procedure are generated and logged for future reference at Block 390. The first extraction and validation procedure is complete and the flow continues to the second extraction and validation procedure.

During the second pass of the extraction operation, the interconnectivity between scan latches of the test hardware is validated. The second extraction procedure is illustrated in Blocks 400–480 of FIG. 6. Whereas the first extraction procedure was concerned with the test signal output ports of a test control block, the second extraction procedure is concerned with the test data output ports of the test control block of interest. At Block 400, a traversable instance of the instances to which a test data signal resident at a test data output port of the test control block will fan to is traversed. Decision Block 410 makes an inquiry as to whether the traversal has indicated that the instance is a scan latch instance. If the instance is a scan latch instance, then the electrical quality of the scan latch instance is checked and any electrical quality errors discovered during the process are logged as failures at Block 415. The inquiry at Decision Block 420 is whether each scan latch port of the scan latch instance has been previously traversed during the first extraction pass. If no, this is indicative of a floating condition, meaning that there is at least one scan latch port that is not connected to a global test signal originating from a TAP or MTAPs. A scan latch port error is generated and logged for each such defective scan latch port at Block 430. The next step, at Block 440 is to traverse the data output ports of the traversable instance in order to identify all new instances to which the test data signals resident at the data output ports of the instance will fan out to. Traversing the output port of the instance at Block 440 may reveal new instances that must, in turn, each be traversed (similar in concept to the traversal of newly identified instances during the first extraction operation at Blocks 360–370) by returning to Block 410 for each newly identified instance, as indicated by Block 445. Block 445 ensures that the flow of Blocks 410–440 is performed for each new instance identified at Block 440 in a recursive manner before the flow proceeds to Decision Block 450.

At Decision Block 450, it must be ascertained as to whether every traversable instance of the test data output port has been traversed. If each eligible instance has not been traversed, then the flow returns to Block 400. If each traversable instance of the test data output port has been traversed, then the flow continues to Decision Block 460, to determine whether there are any more test data output ports of the test control block that have not been traversed. If there are, then the flow of Blocks 400–450 is repeated for a new test data output port, as indicated at Block 470. If all test data output ports. of the test control block have been validated through traversal, then at Block 480, any applicable scan latch inter-connectivity errors are generated and logged. Finally, at Block 490 each scan latch instance that was traversed during the first pass but not the second pass of the extraction procedure is logged as a scan latch floating error. The flow would next continue to Blocks 260 and 270 of FIG. 5.

It should be noted that the methodology of FIG. 6 is practiced for any and every test control block of interest in the IC chip, including the TAP and any MTAPs and associated test circuitry that must be validated.

The methodology of FIG. 6 may be accomplished through software, in the form of a script. The script allows the test hardware portion to be performed automatically from the user's perspective. The methodology of the present invention may be implemented as executable computer program instructions of a computer readable medium that when executed by a processing system provide for automatic validation of subject test hardware.

The process of the preferred embodiment of FIGS. 5–6 allow the pass/fail results obtained during validation of the test hardware portion to be obtained during the extraction process itself, thereby dramatically reducing the amount of time required for proving out test hardware. Also, disjointed scan latches were able to be functionally verified during the extraction run. Electrical quality checks of scan latches during the extraction process are also provided; this aspect of the invention is not possible with traditional test hardware validation approaches.

While the invention has been particularly shown and described with reference to a preferred embodiment, it will be understood by those skilled in the art that various changes in form and detail may be made therein without departing from the spirit and scope of the invention.

What is claimed is:

1. A method for automatic validation of test hardware of an integrated circuit device, comprising:

a) extracting and validating a test hardware portion of connectivity of the integrated circuit device, comprising:

1) during a first extraction procedure, validating the connectivity of a plurality of test signals, residing at a plurality of test signal output ports of a test control block of the test hardware portion comprised of a plurality of serially-connected scan latch instances, to the plurality of serially-connected scan latch instances;

2) generating and logging any test signal connectivity errors identified during validating the connectivity of the plurality of test signals to the plurality of serially-connected scan latch instances;

3) during a second extraction procedure, validating the inter-connectivity of the plurality of serially-connected scan latch instances; and 4) generating and logging any scan latch inter-connectivity errors identified during validating the inter-connectivity of the plurality of serially-connected scan latch instances;

b) representing the extracted and validated test hardware portion of the connectivity of the test hardware in a block description language;

c) using any logged test signal connectivity errors and any scan latch inter-connectivity errors to improve the test hardware portion.

2. The method of claim 1, wherein the first extraction procedure comprises:

1) for each test signal output port of a plurality of test signal output ports of a test control block of the test hardware portion, comprising:

A) for a test signal output port of the plurality of test signal output ports of the test control block, assigning a test signal output port signal type;

B) for an instance of a plurality of instances of the test hardware portion designated as being permissible to traverse and to which a test signal resident at the test signal output port will fan out to, traversing through the instance to determine if the instance is a scan latch instance of a plurality of scan latch instances of the test hardware portion, C) if the instance is a scan latch instance, determining whether the test signal that has traversed to a scan latch port of a plurality of scan latch ports of the scan latch instance is of a type that is properly provided to the scan latch port, wherein if the type of the test signal is not of a type that is properly provided to the scan latch port generating and logging a test signal type error;

D) if the instance is not a scan latch instance, comprising:
  i) for every port of a plurality of ports of the instance that is designated as being permissible to traverse assigning a signal type based upon an instance type of the instance and a type of an input signal to the instance;
  ii) traversing the plurality of ports of the instance to identify a first plurality of new instances to which a plurality of test signals resident at the plurality of ports will flow; and
  iii) performing 1Di)–1Dii) for each new instance of the first plurality of new instances identified;

E) determining whether each instance of the plurality of instances to which the test signal resident at the test signal output port will fan out to and that has been designated as being permissible to traverse has been traversed;

F) if each instance of the plurality of instances has not been traversed, returning to 1B)) to traverse another, untraversed instance of the plurality of instances designated as being permissible to traverse;

G) if each instance of the plurality of instances has been traversed, returning to 1A) if 1A) to 1E) has not been performed for each test signal output port of the plurality of test signal output ports;

H) generating and logging any test signal connectivity errors identified during 1A) to 1G); and wherein the second extraction procedure comprises:

2) for each test data output port of a plurality of test data output ports of the test control block of the test hardware portion, comprising:
  A) for an instance of a plurality of instances of the test hardware portion designated as being permissible to traverse and to which a test data signal resident at the test data output port will fan out to, traversing through the instance to determine if the instance is a scan latch instance of the plurality of scan latch instances of the test hardware portion;
  B) if the instance is a scan latch instance, performing an electrical quality check of the scan latch instance and logging any electrical quality errors and determining whether each scan latch port of the plurality of scan latch ports of the scan latch instance have been previously traversed during 1A)–1H);
  C) if each scan latch port of the plurality of scan latch ports of the scan latch instance has not been previously traversed during a1), generating and logging a scan latch port error for each scan latch port that has not been previously traversed;
  D) traversing a plurality of data output ports of the instance that is designated as being permissible to traverse to identify a second plurality of new instances to which a plurality of test data signals resident at the plurality of data output ports will flow;
  E) performing 2B)–2E) for each new instance of the second plurality of new instances identified in 2D);
  F) determining whether each instance of the plurality of instances to which the data signal will fan out to and that has been designated as being permissible to traverse has been traversed;
  G) if each instance of the plurality of instances has not been traversed, returning to 2A) to traverse another, untraversed instance of the plurality of instances designated as being permissible to traverse;
  H) if each instance of the plurality of instances has been traversed, returning to 2) if 2A) to 2G) has not been performed for each test data output port of the plurality of output test ports of the test control block; and
  I) generating and logging any scan latch inter-connectivity errors identified during 2A) to 2H).

3. The method of claim 2, wherein a) extracting and validating the test hardware portion of connectivity of the integrated circuit device further comprises:
  3) for each scan latch instance traversed in 1) but not in 2), generating and logging a scan latch floating error to generate a plurality of scan latch floating errors.

4. The method of claim 3, wherein any scan latch floating errors, in addition to any logged test signal connectivity errors and any scan latch inter-connectivity errors, are used to improve the test hardware portion.

5. The method of claim 1, wherein a) extracting and validating the test hardware portion of connectivity of the integrated circuit device further comprises:
  5) repeating 1)–4) for each test control block of a plurality of test control blocks of the test hardware portion.

6. The method of claim 1, wherein the test control block is a test access port (TAP) block.

7. The method of claim 1, wherein the test control block is a mini-test access port (MTAP) of a plurality of MTAPs of the test hardware portion.

8. A computer readable medium containing executable instructions which, when executed in a processing system, causes the system to automatically validate test hardware of an integrated circuit device, comprising:
  a) instructions for extracting and validating a test hardware portion of connectivity of the integrated circuit device, comprising:
    1) during a first extraction procedure, instructions for validating the connectivity of a plurality of test signals, residing at a plurality of test signal output ports of a test control block of the test hardware portion comprised of a plurality of serially-connected scan latch instances, to the plurality of serially-connected scan latch instances;
    2) instructions for generating and logging any test signal connectivity errors identified during validating the connectivity of the plurality of test signals to the plurality of serially-connected scan latch instances;
    3) during a second extraction procedure, instructions for validating the inter-connectivity of the plurality of serially-connected scan latch instances; and
    4) instructions for generating and logging any scan latch inter-connectivity errors identified during validating the inter-connectivity of the plurality of serially-connected scan latch instances;
  b) instructions for representing the extracted and validated test hardware portion of the connectivity of the test hardware in a block description language;
  c) instructions for using any logged test signal connectivity errors and any scan latch inter-connectivity errors to improve the test hardware portion.

9. The computer readable medium of claim 8, wherein the first extraction procedure comprises:
  1) for each test signal output port of a plurality of test signal output ports of a test control block of the test hardware portion, comprising:

A) for a test signal output port of the plurality of test signal output ports of the test control block, instructions for assigning a test signal output port signal type;

B) for an instance of a plurality of instances of the test hardware portion designated as being permissible to traverse and to which a test signal resident at the test signal output port will fan out to, instructions for traversing through the instance to determine if the instance is a scan latch instance of a plurality of scan latch instances of the test hardware portion;

C) if the instance is a scan latch instance, instructions for determining whether the test signal that has traversed to a scan latch port of a plurality of scan latch ports of the scan latch instance is of a type that is properly provided to the scan latch port, wherein if the type of the test signal is not of a type that is properly provided to the scan latch port generating and logging a test signal type error;

D) if the instance is not a scan latch instance, comprising:
  i) for every port of a plurality of ports of the instance that is designated as being permissible to traverse instructions for assigning a signal type based upon an instance type of the instance and a type of an input signal to the instance;
  ii) instructions for traversing the plurality of ports of the instance to identify a first plurality of new instances to which a plurality of test signals resident at the plurality of ports will flow; and
  iii) performing 1Di)–1Dii) for each new instance of the first plurality of new instances identified;

E) instructions for determining whether each instance of the plurality of instances to which the test signal resident at the test signal output port will fan out to and that has been designated as being permissible to traverse has been traversed;

F) if each instance of the plurality of instances has not been traversed, returning to 1B)) to traverse another, untraversed instance of the plurality of instances designated as being permissible to traverse;

G) if each instance of the plurality of instances has been traversed, returning to 1A) if 1A) to 1E) has not been performed for each test signal output port of the plurality of test signal output ports;

H) instructions for generating and logging any test signal connectivity errors identified during 1A) to 1G); and wherein the second extraction procedure comprises:

2) for each test data output port of a plurality of test data output ports of the test control block of the test hardware portion, comprising:
  A) for an instance of a plurality of instances of the test hardware portion designated as being permissible to traverse and to which a test data signal resident at the test data output port will fan out to, instructions for traversing through the instance to determine if the instance is a scan latch instance of the plurality of scan latch instances of the test hardware portion;
  B) if the instance is a scan latch instance, instructions for performing an electrical quality check of the scan latch instance and logging any electrical quality errors and instructions for determining whether each scan latch port of the plurality of scan latch ports of the scan latch instance have been previously traversed during 1A)–1H);
  C) if each scan latch port of the plurality of scan latch ports of the scan latch instance has not been previously traversed during a1), instructions for generating and logging a scan latch port error for each scan latch port that has not been previously traversed;

D) instructions for traversing a plurality of data output ports of the instance that is designated as being permissible to traverse to identify a second plurality of new instances to which a plurality of test data signals resident at the plurality of data output ports will flow;
  E) performing 2B)–2E) for each new instance of the second plurality of new instances identified in 2D);
  F) instructions for determining whether each instance of the plurality of instances to which the data signal will fan out to and that has been designated as being permissible to traverse has been traversed;
  G) if each instance of the plurality of instances has not been traversed, returning to 2A) to traverse another, untraversed instance of the plurality of instances designated as being permissible to traverse;
  H) if each instance of the plurality of instances has been traversed, returning to 2) if 2A) to 2G) has not been performed for each test data output port of the plurality of output test ports of the test control block; and
  I) instructions for generating and logging any scan latch inter-connectivity errors identified during 2A) to 2H).

10. The computer readable medium of claim 9, wherein a) extracting and validating the test hardware portion of connectivity of the integrated circuit device further comprises:
  1) for each scan latch instance traversed in a1) but not in a2), instructions for generating and logging a scan latch floating error to generate a plurality of scan latch floating errors.

11. A method for automatic validation of test hardware of an integrated circuit device, comprising:
  a) extracting and validating a test hardware portion of connectivity of the integrated circuit device, comprising:
    1) for each test signal output port of a plurality of test signal output ports of a test control block of the test hardware portion, comprising:
      A) for a test signal output port of the plurality of test signal output ports of the test control block, assigning a test signal output port signal type;
      B) for an instance of a plurality of instances of the test hardware portion designated as being permissible to traverse and to which a test signal resident at the test signal output port will fan out to, traversing through the instance to determine if the instance is a scan latch instance of a plurality of scan latch instances of the test hardware portion;
      C) if the instance is a scan latch instance, determining whether the test signal that has traversed to a scan latch port of a plurality of scan latch ports of the scan latch instance is of a type that is properly provided to the scan latch port, wherein if the type of the test signal is not of a type that is properly provided to the scan latch port generating and logging a test signal type error;
      D) if the instance is not a scan latch instance, comprising:
        i) for every port of a plurality of ports of the instance that is designated as being permissible to traverse assigning a signal type based upon an instance type of the instance and a type of an input signal to the instance;

ii) traversing the plurality of ports of the instance to identify a first plurality of new instances to which a plurality of test signals resident at the plurality of ports will flow; and iii) performing a1Di)–a1Dii) for each new instance of the first plurality of new instances identified;

E) determining whether each instance of the plurality of instances to which the test signal resident at the test signal output port will fan out to and that has been designated as being permissible to traverse has been traversed;

F) if each instance of the plurality of instances has not been traversed, returning to a1B)) to traverse another, untraversed instance of the plurality of instances designated as being permissible to traverse;

G) if each instance of the plurality of instances has been traversed, returning to a1A) if a1A) to a1E) has not been performed for each test signal output port of the plurality of test signal output ports;

H) generating and logging any test signal connectivity errors identified during a1A) to a1G);

2) for each test data output port of a plurality of test data output ports of the test control block of the test hardware portion, comprising:

A) for an instance of a plurality of instances of the test hardware portion designated as being permissible to traverse and to which a test data signal resident at the test data output port will fan out to, traversing through the instance to determine if the instance is a scan latch instance of the plurality of scan latch instances of the test hardware portion;

B) if the instance is a scan latch instance, performing an electrical quality check of the scan latch instance and logging any electrical quality errors and determining whether each scan latch port of the plurality of scan latch ports of the scan latch instance have been previously traversed during a1A)–a1H);

C) if each scan latch port of the plurality of scan latch ports of the scan latch instance has not been previously traversed during a1), generating and logging a scan latch port error for each scan latch port that has not been previously traversed;

D) traversing a plurality of data output ports of the instance that is designated as being permissible to traverse to identify a second plurality of new instances to which a plurality of test data signals resident at the plurality of data output ports will flow;

E) performing a2B)–a2E) for each new instance of the second plurality of new instances identified in a2D);

F) determining whether each instance of the plurality of instances to which the data signal will fan out to and that has been designated as being permissible to traverse has been traversed;

G) if each instance of the plurality of instances has not been traversed, returning to a2A) to traverse another, untraversed instance of the plurality of instances designated as being permissible to traverse;

H) if each instance of the plurality of instances has been traversed, returning to a2) if a2A) to a2G) has not been performed for each test data output port of the plurality of output test ports of the test control block; and I) generating and logging any scan latch inter-connectivity errors identified during a2A) to a2H);

3) for each scan latch instance traversed in a1) but not in a2), generating and logging a scan latch floating error to generate a plurality of scan latch floating errors;

b) representing the extracted and validated test hardware portion of the connectivity of the test hardware in a block description language; and c) using any logged test signal connectivity errors, scan latch inter-connectivity errors, and scan latch floating errors to improve the test hardware portion.

12. The method of claim 11, wherein a) extracting and validating the test hardware portion of connectivity of the integrated circuit device further comprises:

4) repeating 1)–3) for each test control block of a plurality of test control blocks of the test hardware portion.

13. The method of claim 11, wherein the test control block is a test access port (TAP) block.

14. The method of claim 11, wherein the test control block is a mini-test access port (MTAP) of a plurality of MTAPs of the test hardware portion.

15. The method of claim 11, wherein determining whether the test signal is of the type that is properly provided to the scan latch port, if the instance is a scan latch instance, is accomplished by referring to a file containing the plurality of scan latch ports of the scan latch instance and the types of allowable test signal types for each scan latch port of the plurality of scan latch ports.

16. A computer readable medium containing executable instructions which, when executed in a processing system, causes the system to automatically validate test hardware of an integrated circuit device, comprising:

a) instructions for extracting and validating a test hardware portion of connectivity of the integrated circuit device, comprising:

1) for each test signal output port of a plurality of test signal output ports of a test control block of the test hardware portion, comprising:

A) for a test signal output port of the plurality of test signal output ports of the test control block, instructions for assigning a test signal output port signal type;

B) for an instance of a plurality of instances of the test hardware portion designated as being permissible to traverse and to which a test signal resident at the test signal output port will fan out to, instructions for traversing through the instance to determine if the instance is a scan latch instance of a plurality of scan latch instances of the test hardware portion;

C) if the instance is a scan latch instance, instructions for determining whether the test signal that has traversed to a scan latch port of a plurality of scan latch ports of the scan latch instance is of a type that is properly provided to the scan latch port, wherein if the type of the test signal is not of a type that is properly provided to the scan latch port generating and logging a test signal type error;

D) if the instance is not a scan latch instance, comprising:

i) for every port of a plurality of ports of the instance that is designated as being permissible to traverse instructions for assigning a signal type based upon an instance type of the instance and a type of an input signal to the instance;

ii) instructions for traversing the plurality of ports of the instance to identify a first plurality of new instances to which a plurality of test signals resident at the plurality of ports will flow; and iii) instructions for performing 1Di)–1Diii) for each new instance of the first plurality of new instances identified;

E) instructions for determining whether each instance of the plurality of instances to which the test signal resident at the test signal output port will fan out to and that has been designated as being permissible to traverse has been traversed;

F) if each instance of the plurality of instances has not been traversed, returning to a1B)) to traverse another, untraversed instance of the plurality of instances designated as being permissible to traverse;

G) if each instance of the plurality of instances has been traversed, returning to a1A) if a1A) to a1E) has not been performed for each test signal output port of the plurality of test signal output ports;

H) instructions for generating and logging any test signal connectivity errors identified during a1A) to a1G);

2) for each test data output port of a plurality of test data output ports of the test control block of the test hardware portion, comprising:

A) for an instance of a plurality of instances of the test hardware portion designated as being permissible to traverse and to which a test data signal resident at the test data output port will fan out to, instructions for traversing through the instance to determine if the instance is a scan latch instance of the plurality of scan latch instances of the test hardware portion;

B) if the instance is a scan latch instance, instructions for performing an electrical quality check of the scan latch instance and logging any electrical quality errors and instructions for determining whether each scan latch port of the plurality of scan latch ports of the scan latch instance have been previously traversed during a1A)–a1H);

C) if each scan latch port of the plurality of scan latch ports of the scan latch instance has not been previously traversed during a1), instructions for generating and logging a scan latch port error for each scan latch port that has not been previously traversed;

D) instructions for traversing a plurality of data output ports of the instance that is designated as being permissible to traverse to identify a second plurality of new instances to which a plurality of test data signals resident at the plurality of data output ports will flow;

E) performing a2B)–a2E) for each new instance of the second plurality of new instances identified in a2D);

F) instructions for determining whether each instance of the plurality of instances to which the data signal will fan out to and that has been designated as being permissible to traverse has been traversed;

G) if each instance of the plurality of instances has not been traversed, returning to a2A) to traverse another, untraversed instance of the plurality of instances designated as being permissible to traverse;

H) if each instance of the plurality of instances has been traversed, returning to a2) if a2A) to a2G) has not been performed for each test data output port of the plurality of output test ports of the test control block; and I) instructions for generating and logging any scan latch inter-connectivity errors identified during a2A) to a2H);

3) for each scan latch instance traversed in a1) but not in a2), instructions for generating and logging a scan latch floating error to generate a plurality of scan latch floating errors;

b) instructions for representing the extracted and validated test hardware portion of the connectivity of the test hardware in a block description language; and c) using any logged test signal connectivity errors, scan latch inter-connectivity errors, and scan latch floating errors to improve the test hardware portion.

17. The computer readable medium of claim 16, wherein a) extracting and validating the test hardware portion of connectivity of the integrated circuit device further comprises:

4) repeating 1)–3) for each test control block of a plurality of test control blocks of the test hardware portion.

18. The computer readable medium of claim 16, wherein the test control block is a test access port (TAP) block.

19. The computer readable medium of claim 16, wherein the test control block is a mini-test access port (MTAP) of a plurality of MTAPs of the test hardware portion.

20. The computer readable medium of claim 16, wherein determining whether the test signal is of the type that is properly provided to the scan latch port, if the instance is a scan latch instance, is accomplished by instructions for referring to a file containing the plurality of scan latch ports of the scan latch instance and the types of allowable test signal types for each scan latch port of the plurality of scan latch ports.

* * * * *